(12) United States Patent
Lai et al.

(10) Patent No.: US 7,982,225 B2
(45) Date of Patent: Jul. 19, 2011

(54) HEAT DISSIPATION DEVICE FOR LED CHIPS

(75) Inventors: Cheng-Tien Lai, Taipei Hsien (TW); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 769 days.

(21) Appl. No.: 11/964,836

(22) Filed: Dec. 27, 2007

(65) Prior Publication Data
US 2009/0095959 A1      Apr. 16, 2009

(30) Foreign Application Priority Data

Oct. 10, 2007   (CN) .......................... 2007 1 0123804

(51) Int. Cl.
  *H01L 33/00*   (2010.01)
  *F28F 7/00*   (2006.01)
(52) U.S. Cl. ..... 257/79; 257/98; 257/103; 257/E33.001; 165/80.3

(58) Field of Classification Search .................... 257/79, 257/98, 103, E33.001; 165/80.3
See application file for complete search history.

(56) References Cited

U.S. PATENT DOCUMENTS
2007/0090737 A1* 4/2007 Hu et al. ..................... 313/11

FOREIGN PATENT DOCUMENTS
CN          1953164 A       4/2007
* cited by examiner

*Primary Examiner* — Hung Vu
*Assistant Examiner* — Vernon P Webb
(74) *Attorney, Agent, or Firm* — Jeffrey T. Knapp

(57) ABSTRACT

A heat dissipation device for removing heat from LED chips includes a heat sink and a plurality of substrates. The heat sink comprises a base plate. A plurality of fins extends upwardly from the base plate. The substrates each have a unidirectional heat transfer and are attached to a bottom face of the heat sink. Each of the substrates defines a first wall on which The LED chips are mounted and a second wall coupled to the heat sink. The substrates only transfer heat from the first wall to the second wall and restrict the heat transfer in a reverse direction. When the LED chips generate heat, the heat is transferred to the fins of the heat sink via the unidirectional substrates to lower temperature of the LED chips.

8 Claims, 3 Drawing Sheets

HEAT DISSIPATION DEVICE FOR LED CHIPS

BACKGROUND OF THE INVENTION

1. Field of the Invention

The present invention relates to a heat dissipation device and particularly to a heat dissipation device for removing heat from LED chips.

2. Description of Related Art

An LED lamp is a type of solid state lighting that utilizes light-emitting diodes (LEDs) as a source of illumination. An LED is a device for transferring electricity to light by using a theory that, if a current is made to flow in a forward direction in a junction comprising two different semiconductors, electrons and holes are coupled at the junction region to generate a light beam. The LED has an advantage in that it is resistant to shock, and has an almost eternal lifetime under a specific condition; thus, the LED lamp is intended to be a cost-effective yet high quality replacement for incandescent and fluorescent lamps.

A high-powered LED light device produces considerable amount of heat, which may cause performance degrade or even damage of the device if the heat is not removed from LED chips of the device efficiently. In an LED light device, the LED chips which are mounted on a substrate are the core for generating light and heat. A transparent cover may be used to cover the LED chips for protecting the LED chips from foreign articles. Although there are many different designs, the major heat dissipation route for the heat produced by the LED chips is usually managed through the substrate to which the LED chips are mounted and a metal heat sink thermally connecting with the substrate.

When the LED light device is used as an outdoor LED lamp, it usually requires a waterproof sealing for the LED chips to protect the LED chips from rain. The LED lamp comprises a heat sink for dissipating heat generated by the LED chips. In a sunny day, the heat sink is exposed directly to the sunlight and heated by sunlight. The heat absorbed by the heat sink from the sunlight is transferred to the LED chips which are in contact with the heat sink. Therefore, the temperature of the LED chips raises enormously, which affects the life-span of the LED chips.

What is needed, therefore, is a heat dissipation device for an LED light device which has an improved structure and overcomes the abovementioned disadvantage.

SUMMARY OF THE INVENTION

A heat dissipation device adapted for removing heat from LED chips, includes a heat sink and a plurality of substrates. The heat sink comprises a base plate which defines a first surface and a second surface opposite to the first surface. A plurality of fins is formed on the second surface of the base plate. The substrates each have a unidirectional heat transfer and are attached to the first surface of the heat sink. Each of the substrates defines a first wall on which the LED chips are mounted and a second wall coupled to the heat sink. The substrates only transfer heat from the first wall to the second wall and restrict the heat transfer in a reversed direction. When the LED chips generate heat, the heat is transferred to the fins via the unidirectional substrates to lower temperature of the LED chips.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
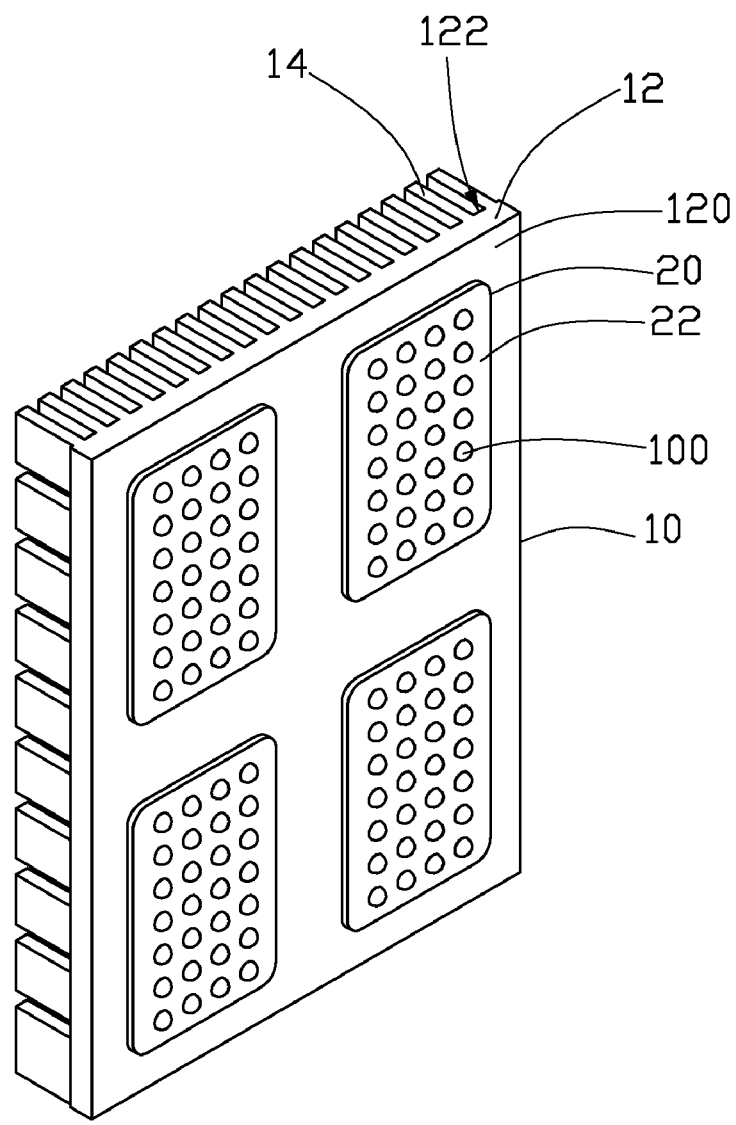
FIG. 1 is an isometric, assembled view of a heat dissipation device in accordance with a preferred embodiment of the present invention.
Figure 2:
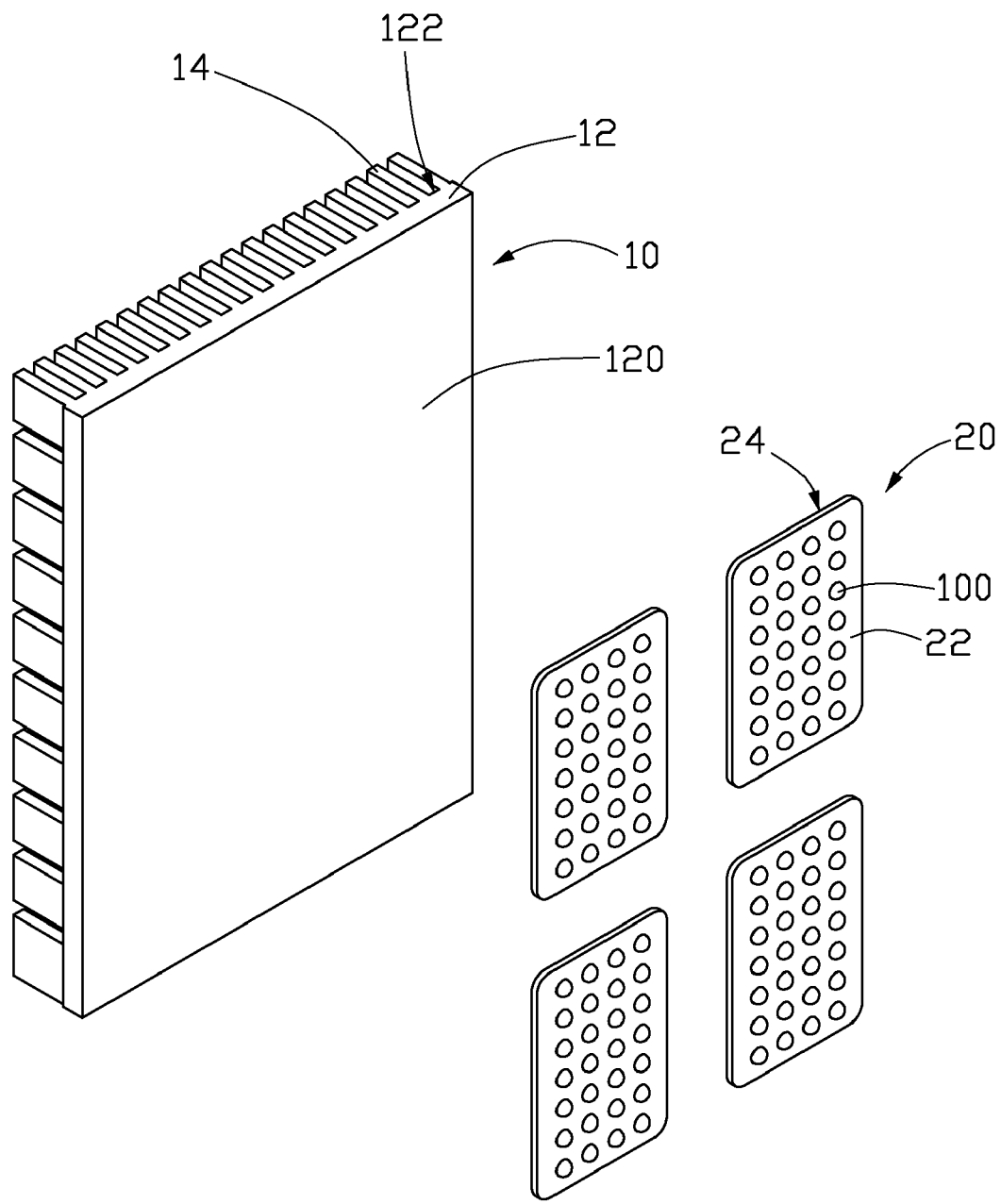
FIG. 2 is an explored view of the heat dissipation device of FIG. 1.
Figure 3:
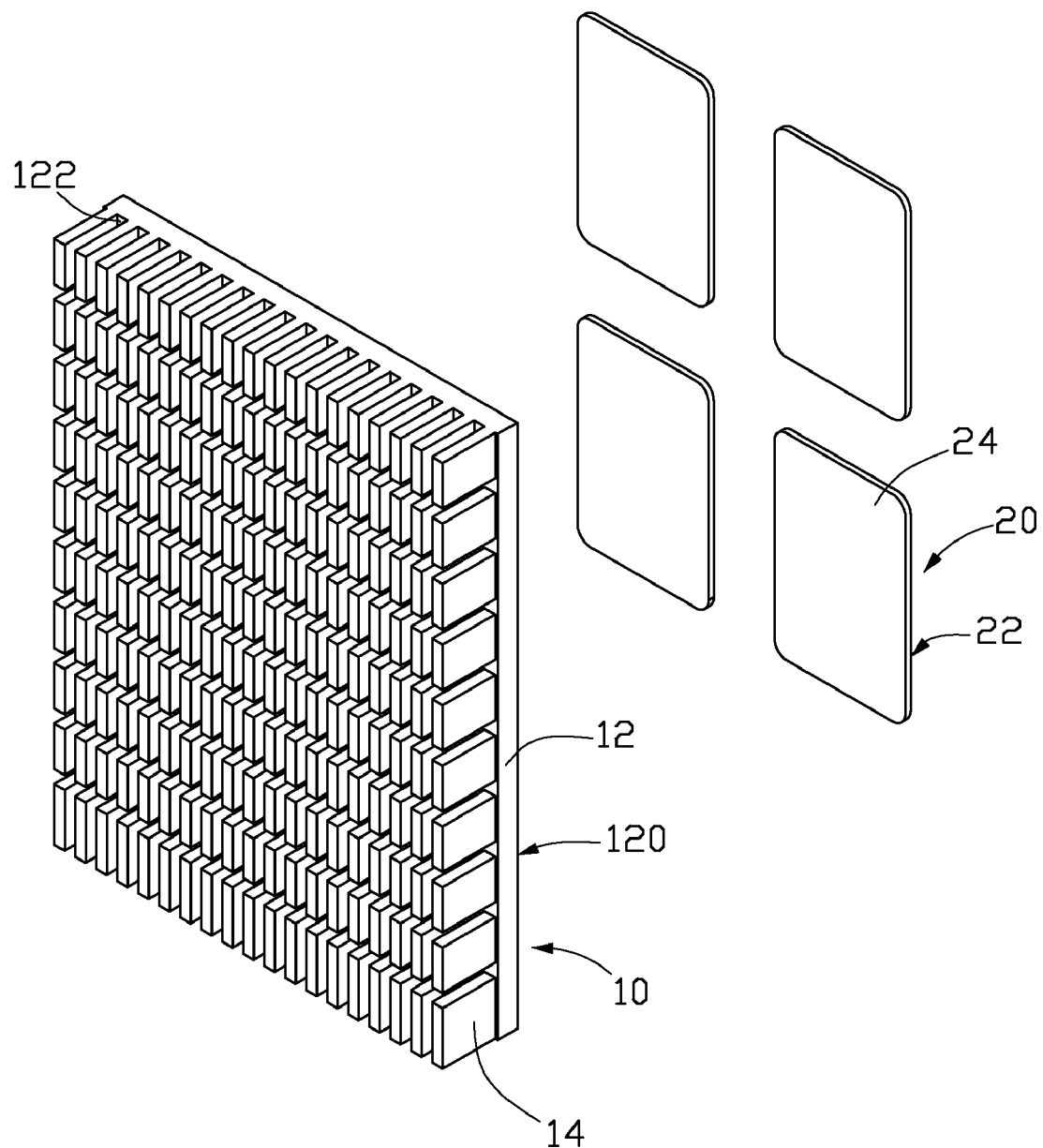
FIG. 3 is a view similar to FIG. 2, but from an opposite direction.

Referring to FIGS. 1-3, a heat dissipation device is used for removing heat from LED chips 100 housed in an outdoor LED lamp (not shown). The heat dissipation device comprises a heat sink 10 and multiple substrates 20 in contact with the heat sink 10. The LED chips 100 are mounted on the substrates 20 and arranged in matrixes.

The heat sink 10 is integrally formed by aluminum extrusion. The heat sink 10 comprises a rectangular base plate 12 and a plurality of fins 14 formed on the base plate 12. The base plate 12 defines a first surface 120 facing the substrates 20 and a second surface 122 opposite the first surface 120. The fins 14 extend from the second surface 122 of the base plate 12 and can be constructed in various configurations to maximize heat-exchanged area of the heat sink 10.

The substrates 20 are formed from a material having a high conductivity such as copper. Each of the substrates 20 is a plate-shaped vapor chamber and comprises a casing (not labeled). The casing defines a first wall 22 facing the LED chips 100 and a second wall 24 parallel to the first wall 22 and facing the heat sink 10. Each of the substrates 20 is designed to be a unidirectional heat transfer device, which means that the substrate 20 can only transfer heat in a direction from the first wall 22 to the second wall 24 and inhibits the heat transfer in a reversed direction, when the first wall 22 faces downwardly. Each of the substrates 20 is provided with a capillary wick (not shown) in the casing thereof for achieving the unidirectional heat transfer. The capillary wick may be a plurality of fine grooves defined in a lengthwise direction of the casing, a fine-mesh wick, or a layer of sintered metal/ceramic powders only formed on an inner side of the first wall 22 distant from the second wall 24. The casing is half filled with working liquid (not shown) which acts as a heat carrier for carrying thermal energy from the first wall 22 to the second wall 24 and the working liquid is just enough to submerge the capillary wick adjacent to the first wall 20 when the first wall 22 faces downwardly toward the ground. Top faces (not labeled) of the second walls 24 are coupled to the first surface 120 of the heat sink 10 by means of soldering or adhering. The LED chips 100 are mounted orderly on bottom faces (not labeled) of the first walls 22.

In use of the heat dissipation device, the substrates 20 on which the LED chips 100 are mounted are thermally attached to the first surface 120 of the base plate 12 of the heat sink 10. Heat produced by the LED chips 100 is delivered to the base plate 12 of the heat sink 10 via the substrates 20 and then is dissipated into ambient air via the fins 14 of the heat sink 10.

It is well known that the outdoor LED lamp is positioned in such a way that the first surface 120 of the base plate 12 of the heat sink 10 faces downward to the ground. In this way, the capillary wick near the first walls 22 of the substrates 20 is submerged in the working liquid while the second walls 24 of the substrates 20 is away from the working liquid; thus, heat accumulated in the heat sink 10 by absorbing heat from sunlight can not be transferred to the first walls 22 of the substrates 20 via the second walls 24, whereby the LED chips 100 are protected from being heated by heat of the heat sink 10. In other words, thermal resistance of the substrates 20 regarding the heat transfer from the heat sink 10 to the substrates 20 is greatly higher than that regarding the heat transfer from the substrates 20 to the heat sink 10. Accordingly, in daytime, when the outdoor LED lamp is not activated to generate light and is exposed to sunlight, heat of the sunlight will not heat the LED chips 100 via the heat sink 10. Meanwhile, in night, when the outdoor LED lamp is activated to generate light, the heat generated by the LED chips 100 can be effectively dissipated to air by the heat sink 10, where the working liquid in the substrates 20 has a continuous, two-phase circulation in the substrates 20 to transfer the heat of the LED chips 100 to the heat sink 10.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for removing heat from LED chips, comprising:
    a heat sink comprising a base plate which defines a first surface and a second surface opposite to the first surface, and a plurality of fins formed on the second surface of the base plate; and
    a plurality of substrates of unidirectional heat transfer being attached to the first surface of the heat sink, each of the substrates defining a first wall on which the LED chips are mounted and a second wall coupled to the heat sink, the substrates only transferring heat from the first wall to the second wall and restricting heat transfer in a reversed direction;
    wherein when the LED chips generate heat, the heat is transferred to the fins via the unidirectional substrates to lower temperature of the LED chips;
    wherein each of the substrates is a plate-shaped vapor chamber and provided with a capillary wick therein; and
    wherein the capillary wick in the each of the substrates is a layer of sintered metal/ceramic powders only formed on an inner side of the first wall and away from the second wall.

2. The heat dissipation device as claimed in claim 1, wherein the each of the substrates is half filled with working liquid which is just enough to submerge the capillary wick adjacent to the first wall when the first wall faces downwardly toward the ground.

3. The heat dissipation device as claimed in claim 1, wherein the fins extend from the second surface of the base plate and can be constructed in various configurations to maximize heat-exchanged area of the heat sink.

4. A heat dissipation device adapted for removing heat from LED chips, comprising:
    a finned heat sink comprising a base plate;
    a plurality of substrates each comprising a casing which is half filled with working liquid and has a first wall on which the LED chips are mounted and a second wall in contact with the base plate of the heat sink;
    wherein each of the substrates is provided with a capillary wick which consists of a layer of sintered metal/ceramic powders only formed on an inner side of the first wall and away from the second wall, and the working liquid which is just enough to submerge the capillary wick adjacent to the first wall when the first wall faces downwardly toward the ground.

5. The heat dissipation device as claimed in claim 4, wherein the substrates each are a plate-shaped vapor chamber, and the second surfaces of the substrates are coupled to the base plate of the heat sink by means of one of soldering and adhering.

6. The heat dissipation device as claimed in claim 4, wherein the base plate defines a first surface coupled with the second surface of the substrates and a second surface opposite the first surface.

7. The heat dissipation device as claimed in claim 6, wherein a plurality of fins extend from the second surface of the base plate and can be constructed in various configurations to maximize heat-exchanged area of the heat sink.

8. An LED assembly comprising:
    a heat sink having a plurality of fins;
    a plurality of plate-shaped vapor chambers attached to the heat sink; and
    a plurality of LED chips thermally connected to the vapor chambers;
    wherein the vapor chambers allow heat generated by the LED chips to be transferred to the heat sink to be dissipated to air via the vapor chambers, while the vapor chamber inhibit heat in the heat sink to be transferred to the LED chips via the vapor chambers; and
    wherein each of the vapor chambers has a first wall on which the LED chips are mounted and a second wall in contact with the heat sink, and is provided with a layer of sintered metal/ceramic powders which is only formed on an inner side of the first wall and away from the second wall.

* * * * *